(12) United States Patent
Pillalamarri (10) Patent No.: US 7,713,835 B2
(45) Date of Patent: May 11, 2010

(54) THERMALLY DECOMPOSABLE SPIN-ON BONDING COMPOSITIONS FOR TEMPORARY WAFER BONDING

(75) Inventor: Sunil K. Pillalamarri, Austin, TX (US)

(73) Assignee: Brewer Science Inc., Rolla, MO (US)

(*) Notice: Subject to any disclaimer, the term of this patent is extended or adjusted under 35 U.S.C. 154(b) by 107 days.

(21) Appl. No.: 11/866,908

(22) Filed: Oct. 3, 2007

(65) Prior Publication Data

US 2008/0173970 A1 Jul. 24, 2008

Related U.S. Application Data

(60) Provisional application No. 60/828,572, filed on Oct. 6, 2006, provisional application No. 60/828,579, filed on Oct. 6, 2006.

(51) Int. Cl.
*H01L 21/30* (2006.01)
*H01L 23/02* (2006.01)

(52) U.S. Cl. .................... 438/455; 257/686

(58) Field of Classification Search .................. 257/499, 257/630, 618, 629, 686, E21.122; 438/455, 438/118, 406; 156/60, 272.2; 347/59
See application file for complete search history.

(56) References Cited

U.S. PATENT DOCUMENTS

| | | | |
|---|---|---|---|
| 3,970,494 A | | 7/1976 | Pritchard |
| 4,474,942 A | * | 10/1984 | Sano et al. .................. 528/363 |
| 4,558,114 A | * | 12/1985 | Goel .......................... 528/73 |
| 4,710,542 A | * | 12/1987 | Forgione et al. ............ 525/127 |
| 5,043,250 A | * | 8/1991 | West et al. ................ 430/278.1 |
| 6,054,363 A | | 4/2000 | Sakaguchi |
| 6,110,999 A | | 8/2000 | Ourth et al. |
| 6,235,818 B1 | | 5/2001 | Morizono et al. |
| 6,869,894 B2 | | 3/2005 | Moore |
| 7,084,201 B2 | | 8/2006 | Garfield et al. |
| 7,098,152 B2 | | 8/2006 | Moore |
| 2002/0115263 A1 | * | 8/2002 | Worth et al. ................. 438/455 |
| 2003/0149207 A1 | * | 8/2003 | Walter et al. ................ 526/259 |

(Continued)

FOREIGN PATENT DOCUMENTS

EP 0 133 357 * 7/1988

(Continued)

OTHER PUBLICATIONS

Rivas et al., "thermal degradation of copolymers . . . ", 1994, Polymer Bulletin, vol. 33, pp. 97-101.*

(Continued)

*Primary Examiner*—Thomas L Dickey
*Assistant Examiner*—Nikolay Yushin
(74) *Attorney, Agent, or Firm*—Hovey Williams LLP (57) ABSTRACT

New spin-on, bonding compositions and methods of using those compositions are provided. The cured bonding compositions comprise a crosslinked oxazoline (either crosslinked with another oxazoline or with a crosslinking agent), and can be used to bond an active wafer to a carrier wafer or substrate to assist in protecting the active wafer and its active sites during subsequent processing and handling. The compositions form bonding layers that are chemically and thermally resistant, but that can be thermally decomposed at 285° C. or higher to allow the wafers to slide apart at the appropriate stage in the fabrication process.

23 Claims, 5 Drawing Sheets

U.S. PATENT DOCUMENTS

| | | | |
|---|---|---|---|
| 2003/0168158 | A1 | 9/2003 | Kato |
| 2004/0185187 | A1 | 9/2004 | Yokoyama et al. |
| 2004/0213994 | A1* | 10/2004 | Kozakai et al. ............ 428/354 |
| 2004/0260021 | A1 | 12/2004 | Macedo et al. |
| 2004/0266947 | A1 | 12/2004 | Macedo et al. |
| 2005/0164509 | A1 | 7/2005 | Koshimizu et al. |
| 2005/0173064 | A1 | 8/2005 | Miyanari |
| 2005/0181579 | A1 | 8/2005 | Thallner |
| 2005/0191779 | A1* | 9/2005 | Le Vaillant et al. ............ 438/24 |
| 2006/0003165 | A1* | 1/2006 | Akatsuka et al. ............ 428/413 |
| 2006/0183269 | A1 | 8/2006 | Fuergut et al. |

FOREIGN PATENT DOCUMENTS

| | | | |
|---|---|---|---|
| EP | 1 700 896 | | 9/2006 |
| WO | WO 91/06587 | * | 5/1991 |
| WO | WO 2006/093639 | | 9/2006 |

OTHER PUBLICATIONS

Boustedt et al., "Flip Chip as an Enabler for MEMS Packaging", 2002, 2002 IEEE Electronics Components and technology Conference, pp. 124-128.*

Watanabe et al., "Three-Component Negative Photosensitive Polyimide Precursor . . . ", 2004, Journal of polymer Science: Part A, vol. 43, pp. 693-599.*

Niklaus, "Adhesive wafer bonding", 2006, Journal of Applied physics, vol. 99, pp. 031101-1—28.*

Frump, "Oxazolines. their preparation, reactions, and applications", 1971, vol. 71 (5), pp. 483-505.*

Buna EP T 6250, Lanxess, Lanxess Deutschland GmbH, Business Unit Technical Rubber Products, Product Data Sheet.

Eastman, Eastotac, http://www.eastman.com/brands/eastotac/producthome.asp?product=71016204.

Eastman, Product Data Sheet, Eastotac Resin H-142W, http://eastman.com/productcatalogapps/pagecontrollers/proddatasheet_PC.aspx?

F. Niklaus et al., "Adhesive Wafer Bonding," J. Appl. Phys., 2006, 99, 031101.

J. Moore et al., "High Temperature Resistant Adhesive for Wafer Thinning and Backside Processing," MANTECH 2004, 8.10, 4 pages.

C. Brubaker et al., "Advances in Processing of Compound Semiconductor Substrates," MANTECH 2005, 4 pages.

S. Combe et al., "Reversible Wafer Bonding: Challenges in Ramping up 150mm GaAs Wafer Production to Meet Growing Demand," MANTECH 2006, 4 pages.

Y. Kwon et al., "An Evaluation Process of Polymeric Adhesive Wafer Bonding for Vertical System Integration," Japanese Journal of Applied Physics, vol. 44, No. 6A, 2005, pp. 3893-3902.

Technical DataSheet Abstract Ebecryl 168, UCB Chemicals, Additive, Adhesion promoter/Bonding agent, 2006 SpecialChem S.A., 1 page http://www.specialchem4coatings.com/common/pc/product/displayproduct.aspx?id=12887&srchid=220571.

MatWeb, The Online Materials Database: Zeon Chemicals Zeonex 480R Cyclo Olefin Optical Grade Polymer; Subcategory: Cyclo Olefin Polymer, Polymer, Thermoplastic, 2006, 1 page http://www.matweb.com/search/SpecificMaterialPrint.asp?bassnum=PZEON6.

Frank Niklaus, Adhesive Wafer Bonding Technology, Department of Signals, Sensors and Systems, Royal Institute of Technology (KTH), Stockholm, Sweden, Copyright 2002, 33 pages.

Grunsven et al., "Wafer Level Chip Size Packaging Technology for Power Devices Using Low Ohmic Through-Hole Vias," 14th European Microelectronics and Packaging Conference and Exhibition, Germany, Jun. 23-25, 2003, pp. 46-50.

Fukushima et al., "New Three-Dimensional Integration Technology Using Chip-to-Wafer Bonding to Archive Ultimate Super-Chip Integration," The Japan Society of Applied Physics, vol. 43, Mo. 4B, 2006, 3030-3035.

Library 4 Science, Pinene, 2006, 1 page, http://www.chromatography-online org/topics/pinene.html.

Technical DataSheet Abstract Vanax 808 HP, R.T. Vanderbilt, Additive, Crosslinking Catalyst/Accelerator/Initiator >>Amine or Nitrogen Content, 2006 SpecialChem S.A., 2006, 1 page. http://www.specialchem4polymers.com/common/pa/product/displayproduct.aspx?id=7815&srchid=292522.

Ciba Specialty Chemicals, Additives, Polymer Additives, Ciba IRGANOX 1010, Phenolic Primary Antioxidant for Processing and Long-Term Thermal Stabilization, Oct. 1999, 2 pages.

Ciba Specialty Chemicals, Additives, Polymer Additives, Ciba IRGAFOS 168, Hydrolytically Stable Phosphite Processing Stabilizer, Sep. 1999, 2 pages.

Chemical Land 21, Organic Chemicals, Mesitylene, 1 page.

U.S. Appl. No. 11/348,143, filed Feb. 6, 2006, Moore et al.

U.S. Appl. No. 11/763,253, filed Jun. 14, 2007, Pillalamarri et al.

d-limonene. A data sheet from the Compendium of Pesticide Common Names, 1 page.

Safety (MSDS) data for Triton X-100, 1 page.

ExxonMobil Chemical Vistalon, Vistalon 2504 Specifications, 2005, 1 page.

Material Safety Data Sheet, ExxonMobil Chemical Company, Vistalon Ethylene Propylene Rubber, Apr. 14, 2005, 1 page.

Ides, The Plastics Web, Zeonex 480R, 1 page, 2006, http://www.ides.com/grades/ds/E40300.htm.

Eastman Product Data Sheet, Eastotack H-142W Resin, Sep. 13, 2006, 2 pages, http://www.eastman.com/ProductCatalogApps/PageControllers/ProdDatasheet_PC.aspx?p.

Eastman H-142 Resin, Application Uses and Key Attributes, Sep. 13, 2006, 1 page http://www.eastman.com/products/producthome.asp?product=71016204&SelectorUrl=%2.

www.sigma-aldrich.com, 457531 Poly -a-pinene, Sep. 13, 2006, http://www.sigmaaldrich.com/catalog/search/ProductDetail/ALDRICH/457531?PrtPrv=1.

* cited by examiner

THERMALLY DECOMPOSABLE SPIN-ON BONDING COMPOSITIONS FOR TEMPORARY WAFER BONDING

RELATED APPLICATIONS

The present application claims the priority benefit of U.S. Provisional Patent Application Ser. No. 60/828,572, entitled HIGH-TEMPERATURE SPIN-ON ADHESIVES FOR TEMPORARY WAFER BONDING USING SLIDING APPROACH, filed Oct. 6, 2006, and U.S. Provisional Patent Application Ser. No. 60/828,579 entitled THERMALLY DECOMPOSABLE SPIN-ON ADHESIVES FOR TEMPORARY WAFER BONDING, filed Oct. 6, 2006, both of which are incorporated by reference herein

GOVERNMENT FUNDING

This invention was made with government support under contract number W911SR-05-C-0019 awarded by the United States Army Research, Development, and Engineering Command. The United States Government has certain rights in the invention.

BACKGROUND OF THE INVENTION

1. Field of the Invention

The present invention is broadly concerned with novel spin-on compositions and methods of using those compositions to form thermally decomposable bonding compositions that can support active wafers on a carrier wafer or substrate during wafer thinning and other processing.

2. Description of the Prior Art

Wafer (substrate) thinning has been used to dissipate heat and aid in the electrical operation of the integrated circuits (IC). Thick substrates cause an increase in capacitance, requiring thicker transmission lines, and, in turn, a larger IC footprint. Substrate thinning increases inpedance while capacitance decreases impedance, causing a reduction in transmission line thickness, and, in turn, a reduction in IC size. Thus, substrate thinning facilitates IC miniaturization.

Geometrical limitations are an additional incentive for substrate thinning. Via holes are etched on the backside of a substrate to facilitate frontside contacts. In order to construct a via using common dry-etch techniques, geometric restrictions apply. For substrate thicknesses of less than 100 μm, a via having a diameter of 30-70 μm is constructed using dry-etch methods that produce minimal post-etch residue within an acceptable time. For thick substrates, vias with larger diameters are needed. This requires longer dry-etch times and produces larger quantities of post-etch residue, thus significantly reducing throughput. Larger vias also require larger quantities of metallization, which is more costly. Therefore, for backside processing, thin substrates can be processed more quickly and at lower cost.

Thin substrates are also more easily cut and scribed into ICs. Thinner substrates have a smaller amount of material to penetrate and cut and therefore require less effort. No matter what method (sawing, scribe and break, or laser ablation) is used, ICs are easier to cut from thinner substrates. Most semiconductor wafers are thinned after frontside operations. For ease of handling, wafers are processed (i.e., frontside devices) at their normal full-size thicknesses, e.g., 600-700 μm. Once completed, they are thinned to thicknesses of 100-150 μm. In some cases (e.g., when hybrid substrates such as gallium arsenide (GaAs) are used for high-power devices) thicknesses may be taken down to 25 μm.

Mechanical substrate thinning is performed by bringing the wafer surface into contact with a hard and flat rotating horizontal platter that contains a liquid slurry. The slurry may contain abrasive media along with chemical etchants such as ammonia, fluoride, or combinations thereof. The abrasive provides "gross" substrate removal, i.e., thinning, while the etchant chemistry facilitates "polishing" at the submicron level. The wafer is maintained in contact with the media until an amount of substrate has been removed to achieve a targeted thickness.

For a wafer thickness of 300 μm or greater, the wafer is held in place with tooling that utilizes a vacuum chuck or some means of mechanical attachment. When wafer thickness is reduced to less than 300 μm, it becomes difficult or impossible to maintain control with regard to attachment and handling of the wafer during further thinning and processing. In some cases, mechanical devices may be made to attach and hold onto thinned wafers, however, they are subject to many problems, especially when processes may vary. For this reason, the wafers ("active" wafers) are mounted onto a separate rigid (carrier) substrate or wafer. This substrate becomes the holding platform for further thinning and post-thinning processing. Carrier substrates are composed of materials such as sapphire, quartz, certain glasses, and silicon, and usually exhibit a thickness of 1000 μm. Substrate choice will depend on how closely matched the coefficient of thermal expansion (CTE) is between each material.

One method that has been used to mount an active wafer to a carrier substrate comprises the use of a cured bonding composition. The major drawback with this approach is that the bonding composition must be chemically removed, typically by dissolving in a solvent. This is very time-consuming, thus reducing throughput. Furthermore, the use of the solvent adds to the cost and complexity of the process, and it can be hazardous, depending upon the solvent required to dissolve the bonding composition.

Another method for mounting an active wafer to a carrier substrate is via a thermal release adhesive tape. This process has two major shortcomings. First, the tapes have limited thickness uniformity across the active wafer/carrier substrate interface, and this limited uniformity is often inadequate for ultra-thin wafer handling. Second, the thermal release adhesive softens at such low temperatures that the bonded wafer/carrier substrate stack cannot withstand many typical wafer processing steps that are carried out at higher temperatures.

There is a need for new compositions and methods of adhering an active wafer to a carrier substrate that can endure high processing temperatures and that allow for ready separation of the wafer and substrate at the appropriate stage of the process.

SUMMARY OF THE INVENTION

The present invention overcomes these problems by providing a wafer bonding method where a stack comprising first and second substrates bonded together via a bonding composition layer is exposed to a temperature of at least about 285° C. so as to thermally decompose the bonding composition layer and cause the substrates to separate. The bonding composition layer comprises crosslinked oxazoline groups.

The invention also provides an article comprising a first substrate having a back surface and an active surface; a second substrate having a bonding surface; and a bonding composition layer bonded to the active and bonding surfaces. The invention is also concerned with novel compositions that can be used to form the bonding composition layers used in the inventive methods and articles.

DETAILED DESCRIPTION OF THE PREFERRED EMBODIMENTS

Preparation of Bonding Composition

In more detail, the bonding compositions of the invention comprise a component selected from the group consisting of polymers, oligomers, and/or compounds dispersed or dissolved in a solvent system.

In one embodiment, the component is an oxazoline and preferably has the formula (I)

The composition preferably further comprises a crosslinking agent. Preferred crosslinking agents include those selected from the group consisting of $$X'\text{—}Y\text{—}X',$$ (II)

(III)

(IV)

In (I)-(IV):

each R is individually selected from the group consisting of —H and alkyls (preferably from about $C_1$ to about $C_{12}$, and more preferably from about $C_1$ to about $C_8$);

each R' is individually selected from the group consisting of —H, alkyls (preferably from about $C_1$ to about $C_{12}$, and more preferably from about $C_1$ to about $C_8$), phenyls, —CH$_2$OH, and —C≡N;

each D is individually selected from the group consisting of —C— and —N—;

each Z is individually selected from the group consisting of —SH, —COOH, —OH, —NH$_2$, —PO$_3$H, and —N(CH$_2$OCH$_3$)$_2$;

each X' is individually selected from the group consisting of —OH, —NH$_2$, —SH, —PO$_3$H, and —COOH;

each Y is individually selected from the group consisting of aliphatics (preferably from about $C_1$ to about $C_{12}$, and more preferably from about $C_1$ to about $C_8$), where:

each R" is individually selected from the group consisting of —SO$_2$—, —C(CR$_3$)$_2$—, —O—, and —CR""$_2$—, where each R"" is individually selected from the group consisting of —H, alkyls (preferably from about $C_1$ to about $C_{12}$, and more preferably from about $C_1$ to about $C_8$), and and each R''' is individually selected from the group consisting of —H and the halogens (preferably chlorine, fluorine, and bromine).

It will be appreciated that structure (III) can be replaced with other dianhydrides, which would work as well.

It is preferred that the weight average molecular weight of (I) be from about 1,000 Daltons to about 500,000 Daltons, and more preferably from about 5,000 Daltons to about 100,000 Daltons.

It will be appreciated that in this embodiment, an oxazoline (such as that represented by (I)) can be self-crosslinked, or a crosslinking agent (e.g., a multi-functional amine, phenol, mercaptan, and/or carboxylic acid such as those represented by (II)-(IV) above) can be crosslinked with the oxazoline. When the oxazoline is intended to crosslink with other oxazolines, it is preferred that the total oxazoline present in the composition is from about 5% to about 50% by weight, more preferably from about 5% to about 30% by weight, and even more preferably from about 5% to about 20% by weight, based upon the total weight of solids in the composition taken as 100% by weight. The self-crosslinked oxazoline will have the formula where R and R' are as defined above.

When a separate crosslinking agent is present in the composition, it is preferred that the oxazoline is present in the composition at levels of from about 5% to about 50% by weight, more preferably from about 5% to about 30% by weight, and even more preferably from about 5% to about 20% by weight. In this embodiment, it is preferred that the total crosslinking agent present in the composition be from about 1% to about 25% by weight, more preferably from about 1% to about 15% by weight, and even more preferably from about 2.5% to about 15% by weight, with all of the above percentages by weight being based upon the total weight of solids in the composition taken as 100% by weight.

When the oxazoline is crosslinked with a crosslinking agent, it will be represented by the structure where R, R', and Y are as defined above, and each X is individually selected from the group consisting of —O—, —NH—, —S—, —PO$_3$H, and —COO—.

In either embodiment, a catalyst is preferably present. The catalyst can be an acid or an acid generator such as a photoacid generator or a thermal acid generator. The catalyst should be present at levels of from about 0.1% to about 3% by weight, more preferably from about 0.1% to about 1% by weight, and even more preferably from about 0.1% to about 0.5% by weight, based upon the total weight of solids in the composition taken as 100% by weight.

Preferred catalysts include those selected from the group consisting of triphenylphosphine, tetrabutylphosphoniumbromide, alkali or alkaline metal cationic complexes, and carbonium ion salts. Alkali and alkaline metal cationic complexes are disclosed in U.S. Pat. No. 4,644,052, incorporated by reference, and include those represented by the formula $(M)^n(BF_4)_n$, where M represents the alkali or alkaline metal. Carbonium ion salts are disclosed in U.S. Pat. No. 4,746,719, incorporated by reference, and include those represented by the formula Ph$_3$CX, where Ph represents a phenyl ring, and X is selected from the group consisting of —BF$_4$, —PF$_6$, and —SbF$_4$.

The oxazoline-based bonding compositions can include a number of optional ingredients, including surfactants, adhesion promoting agents, tackifiers, and antioxidants.

When an antioxidant is utilized, it is preferably present in the composition at a level of from about 0.01% to about 3% by weight, more preferably from about 0.01% to about 1.5% by weight, and even more preferably from about 0.01% to about 0.1% by weight, based upon the total weight of the solids in the composition taken as 100% by weight. Examples of suitable antioxidants include those selected from the group consisting of phenolic antioxidants (such as pentaerythritol tetrakis(3-(3,5-di-tert-butyl-4-hydroxyphenyl)propionate sold under the name Irganox® 1010 by Ciba) and phosphite antioxidants (such as tris(2,4-ditert-butylphenyl)phosphite sold under the name Irgafos® 168 by Ciba).

The oxazoline-based bonding compositions can be prepared by dissolving the various ingredients in a solvent system. In embodiments where the oxazoline is crosslinked with a crosslinking agent, two solutions can be prepared and subsequently combined. That is, the oxazoline can be dissolved or dispersed in one solvent system while the crosslinking agent, and any other ingredients can be dissolved in a separate solvent system. These two solutions can then be combined to form the final composition.

In either preparation method, the total solvent present in the final bonding composition will typically be from about 50% to about 95% by weight solvent system, preferably from about 60% to about 95% by weight solvent system, and even more preferably from about 60 to about 85% by weight solvent system, based upon the total weight of the composition taken as 100% by weight. The solvent system should have a boiling point of from about 100-250° C., and preferably from about 120-200° C. Preferred solvent systems include those selected from the group consisting of propylene glycol monomethyl ether (PGME), propylene glycol methyl ether acetate (PGMEA), γ-butyrolactone, N-methyl pyrrolidone (NMP), dimethyl formamide, (DMF), dimethyl acetamide (DMAC), and mixtures thereof.

The oxazoline bonding compositions will preferably self-crosslink when exposed to temperatures of from about 150° C. to about 250° C., and more preferably from about 175° C. to about 225° C. for time periods of from about 60 to about 600 seconds. In embodiments where a separate crosslinking agent is added, the oxazoline will preferably crosslink when exposed to temperatures of from about 150° C. to about 225° C., and more preferably from about 175° C. to about 200° C. for time periods of from about 60 to about 600 seconds.

Application of Bonding Composition

Although the composition could be applied to either the carrier substrate or active wafer first, it is preferred that it be applied to the active wafer first. A preferred application method involves spin-coating the composition at spin speeds of from about 1,000-3,500 rpm (more preferably from about 500-2,000 rpm), at accelerations of from about 300-5,000 rpm/second, and for spin times of from about 30-300 seconds. It will be appreciated that the application steps can be varied to achieve a particular thickness.

After coating, the substrate can be baked (e.g., on a hot plate) to evaporate the solvents. Typical baking would be at temperatures of from about 150-250° C., and preferably from about 175-225° C., for a time period of from about 2-5 minutes, and more preferably from about 2-4 minutes. The film thickness (on top of the topography) after bake will typically be at least about 10 μm, and more preferably from about 5-50 μm.

After baking, the desired carrier wafer is contacted with, and pressed against, the layer of inventive composition. The carrier wafer is bonded to this inventive bonding composition layer at temperatures of from about 150° C. to about 250° C. and preferably under a vacuum of less than about 15 psi and for a time period of from about 1 to about 2 minutes.

Crosslinking of the oxazoline, either with itself or with a crosslinking agent, occurs at this stage.

Processing and Separation of Bonded Wafers

Figure 1:
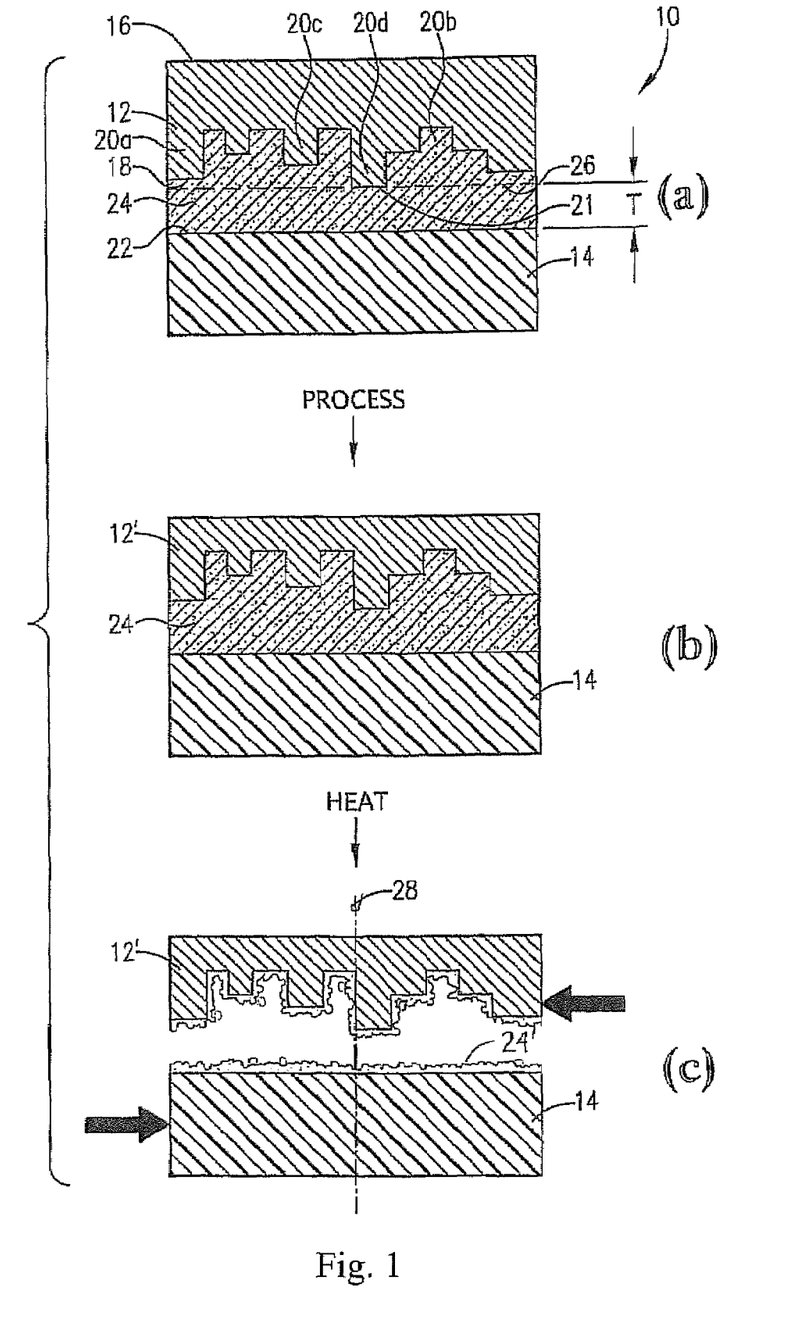
FIG. 1 illustrates the inventive method of thinning a wafer according to the present invention.

The bonded wafer can be subjected to backgrinding, metallization, via forming, and/or other processing steps involved in wafer thinning. FIG. 1(a) shows an exemplary stack 10 comprising active wafer 12 and carrier wafer or substrate 14. Active wafer 12 comprises a back surface 16 and an active surface 18. Active surface 18 can comprise one or more active sites (not shown) as well as a plurality of topographical features (raised features or lines as well as holes, trenches, or spaces) such as, for example, those designated as 20a-d. Feature 20d represents the "highest" feature on active surface 18. That is, the end portion or surface 21 is further from back surface 16 of wafer 12 than the respective end portions of any other topographical feature on wafer 12.

Typical active wafers 12 can include any microelectronic substrate. Examples of some possible active wafers 12 include those selected from the group consisting of microelectromechanical system (MEMS) devices, display devices, flexible substrates (e.g., cured epoxy substrates, roll-up substrates that can be used to form maps), compound semiconductors, low k dielectric layers, dielectric layers (e.g., silicon oxide, silicon nitride), ion implant layers, and substrates comprising silicon, aluminum, tungsten, tungsten silicide, gallium arsenide, germanium, tantalum, tantalum nitrite, SiGe, and mixtures of the foregoing.

Carrier substrate 14 has a bonding surface 22. Typical carrier substrates 14 comprise a material selected from the group consisting of sapphire, ceramic, glass, quartz, aluminum, and silicon.

Wafer 12 and carrier substrate 14 are bonded together via bonding composition layer 24. Bonding composition layer 24 is formed from the bonding composition described above, and has been applied and dried as also described above. As shown in FIG. 1(a), bonding composition layer 24 is bonded to active surface 18 of wafer 12 as well as to bonding surface 22 of substrate 14. Bonding composition layer 24 is a uniform (chemically the same) material across its thickness. In other words, the entire bonding composition layer 24 is formed of the same composition.

It will be appreciated that, because bonding composition layer 24 can be applied to active surface 18 by spincoating or spraying, the bonding composition flows into and over the various topographical features. Furthermore, the bonding composition layer 24 forms a uniform layer over the topography of active surface 18. To illustrate this point, FIG. 1 shows a plane designated by dashed line 26, at end portion 21 and substantially parallel to back surface 16. The distance from this plane to bonding surface 22 is represented by the thickness "T." The thickness T is the total thickness variation, and it will vary by less than about 10%, preferably by less than about 8%, more preferably by less than about 5%, more preferably by less than about 2%, and even more preferably by less than about 1% across the length of plane 26 and substrate 14.

The wafer package can then be subjected to subsequent thinning (or other processing) of the substrate as shown in FIG. 1(b), where 12' represents the wafer 12 after thinning. It will be appreciated that the substrates can be thinned to thicknesses of less than about 100 µm, preferably less than about 50 µm, and more preferably less than about 25 µm. After thinning, typical backside processing, including photolithography, via etching, and metallization, may be performed.

Advantageously, the dried layers of the inventive compositions possess a number of highly desirable properties. For example, the layers will exhibit low outgassing for vacuum etch processes. That is, if a 15-µm thick film of the composition is baked at about 150-175° C. for 2 minutes, the solvents will be driven from the composition so that subsequent baking at 200° C. for about 2-10 minutes results in a film thickness change of less than about 5%, preferably less than about 2%, and even more preferably less than about 1% or even 0% (referred to as the "Film Shrinkage Test"). Thus, the cured or dried layers can be heated to temperatures of up to about 200° C., more preferably up to about 250° C., and even more preferably up to about 280° C. without physical changes or chemical reactions occurring in the layer. For example, the layers will not soften or decompose below these temperatures. The layers can also be exposed to polar solvents (e.g., NMP, PGME) at a temperature of 85° C. for 60 minutes without reacting. The bonding compositions are also thermally stable. When subjected to the thermogravimetric analysis (TGA) test described herein, the bonding compositions will exhibit a % weight loss (after 250° C. for 60 min) of less than about 4%, preferably less than about 2%, and even more preferably less than about 1%.

After the desired processing has occurred, the active wafer or substrate can then be separated by subjecting the wafers to temperatures of at least about 285° C., preferably at least about 300° C., more preferably at least about 350° C., and even more preferably from about 350° C. to about 40° C., preferably in a nitrogen atmosphere. This heating step is preferably carried out for a time period of from about 5 to about 180 minutes, and more preferably from about 5 to about 60 minutes. This heating step will result in the bonding composition layer thermally decomposing so that the wafer 12 and substrate 14 can be separated.

Any bonding composition remaining in the device areas can be removed using NMP as a solvent. This will result in the removal of at least about 95%, preferably at least about 98%, and preferably about 100% of the bonding composition. It is also acceptable to remove remaining bonding composition using a plasma etch, either alone or in combination with a solvent removal process. After this step, a clean, bonding composition-free wafer 12 and carrier substrate 14 (not shown in their clean state) will remain.

EXAMPLES

The following examples set forth preferred methods in accordance with the invention. It is to be understood, however, that these examples are provided by way of illustration and nothing therein should be taken as a limitation upon the overall scope of the invention.

Example 1

Spin-Applied Bonding Composition Based on Crosslinking Oxazoline Groups with Bisphenol Moieties To make this formulation, 37.73 grams of poly(styrene-co-isopropenyl oxazoline) (trade name: EPOCROS RPS-1005; Nippon Shokubai Co. Limited, Osaka, Japan) were dissolved in 83 grams of PGMEA, and 35 grams of PGME. Next, 0.2 gram of 4,4'-sulfonyldiphenol (obtained from Aldrich, Milwaukee, Wis.), 2 grams of Irganox 1010 (obtained from Ciba Specialty Chemicals, Tarrytown, N.Y.), 1.24 grams of triphenylphosphine (obtained from Aldrich, Milwaukee, Wis.), and 30 grams of γ-butyrolactone (obtained from Aldrich, Milwaukee, Wis., USA) were added to this solution.

The formulation was spin-coated onto a device or carrier wafer at different speeds ranging from 500-3,000 rpm to achieve thickness values ranging from 2.5-15 μm. The wafer was baked at 150° C. to remove the solvent. After the solvent evaporated, the supporting or carrier wafer (either glass or silicon) was attached to the coated wafer by applying bonding forces between 3,000-5,000 N at 205° C. for 3-5 minutes. After backgrinding, metallization, and other processing steps such as dielectric cure involved in wafer thinning, the wafers were de-bonded by thermal decomposition in a nitrogen atmosphere at temperatures of 350° C. and 400° C.

Example 2

Spin-Applied Bonding Composition Based on Crosslinking Oxazoline Groups with Bisphenol Moieties Poly(styrene-co-isopropenyl oxazoline) in the amount of 37.73 grams of was dissolved in 83 grams of PGMEA and 35 grams of PGME. Next, 0.4 grams of tetrabromobisphenol-S (obtained from Shanghai Rongheng Co. Limited, Shanghai, China), 2 grains of Irganox 1010, 1.24 grams of triphenylphosphine, and 30 grams of γ-butyrolactone were added to this solution.

The formulation was spin-coated onto a device or carrier wafer at different speeds ranging from 500-3,000 rpm to achieve thickness values ranging from 2.5-15 μm. The wafer was then baked at 150° C. to remove the solvent. After the solvent evaporated, the supporting or carrier wafer (either glass or silicon) was attached to the coated wafer by applying bonding forces between 3,000-5,000 N at 205° C. for 3-5 minutes. After backgrinding, metallization, and other processing steps such as dielectric cure involved in wafer thinning, the wafers were de-bonded by thermal decomposition in a nitrogen atmosphere at temperatures of 350° C. and 400° C.

Example 3

Spin-Applied Bonding Composition Based on Crosslinking Oxazoline Groups with Bisphenol Moieties Poly(styrene-co-acrylonitrile-co-isopropenyloxazoline) was synthesized by free radical polymerization using α,α'-azoisobutyronitrile (AIBN, obtained from Aldrich, Milwaukee, Wis.) as the initiator. This terpolymer is more thermally stable than poly(styrene-co-isopropenyloxazoline). Next, 2.5 grams of bisphenol-S and 0.2 gram of triphenylphosphine were added to 20 grams of the terpolymer.

The formulation was spin-coated onto a device or carrier wafer at different speeds ranging from 500-3,000 rpm to achieve thickness values ranging from 2.5-15 μm. The wafer was baked at 150° C. to remove the solvent. After the solvent evaporated, the supporting or carrier wafer (either glass or silicon) was attached to the coated wafer by applying bonding forces between 3,000-5,000 N at 205° C. for 3-5 minutes. After backgrinding, metallization, and other processing steps such as dielectric cure involved in wafer thinning, the wafers were de-bonded by thermal decomposition in a nitrogen atmosphere at temperatures of 350° C. and 400° C.

Example 4

Spin-Applied Bonding Composition Based on Crosslinking Oxazoline Groups in Presence of Acid Catalyst Poly(styrene-co-isopropenyl oxazoline) in the amount of 37.73 grams was dissolved in 83 grams of PGMEA and 35 grams of PGME. Next, 2 grams of Irganox 1010, 1 gram of tetrabutylphosphoniumbromide (obtained from Aldrich, Milwaukee, Wis.), and 30 grams of γ-butyrolactone were added to this solution.

The formulation was spin-coated onto a device or carrier wafer at different speeds ranging from 500-2,000 rpm to achieve thickness values ranging from 2.5-10 μm. The wafer was baked at 180° C. to remove the solvent. After the solvent evaporated, the supporting or carrier wafer (either glass or silicon) was attached to the coated wafer by applying bonding forces between 3,000-5,000 N at 225° C. for 3-5 minutes. After backgrinding, metallization, and other processing steps such as dielectric cure involved in wafer thinning, the wafers were de-bonded by thermal decomposition in a nitrogen atmosphere at temperatures above 400° C.

Example 5

Rheological Analysis of Compositions Based on Oxazoline Platform

Figure 2A:
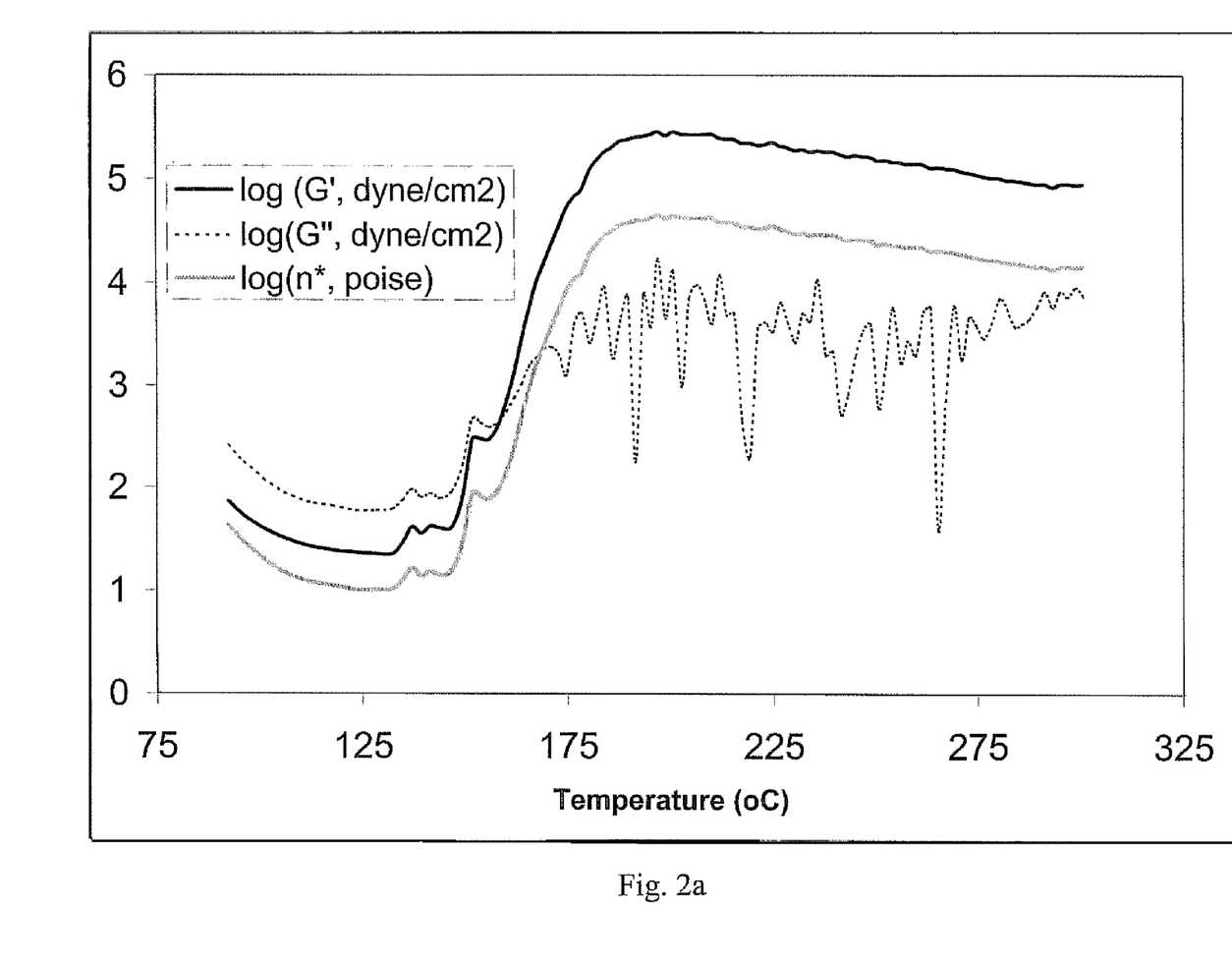
FIGS. 2a and 2b are graphs depicting the rheological analysis results of a bonding composition prepared according to the present invention.
Figure 2B:
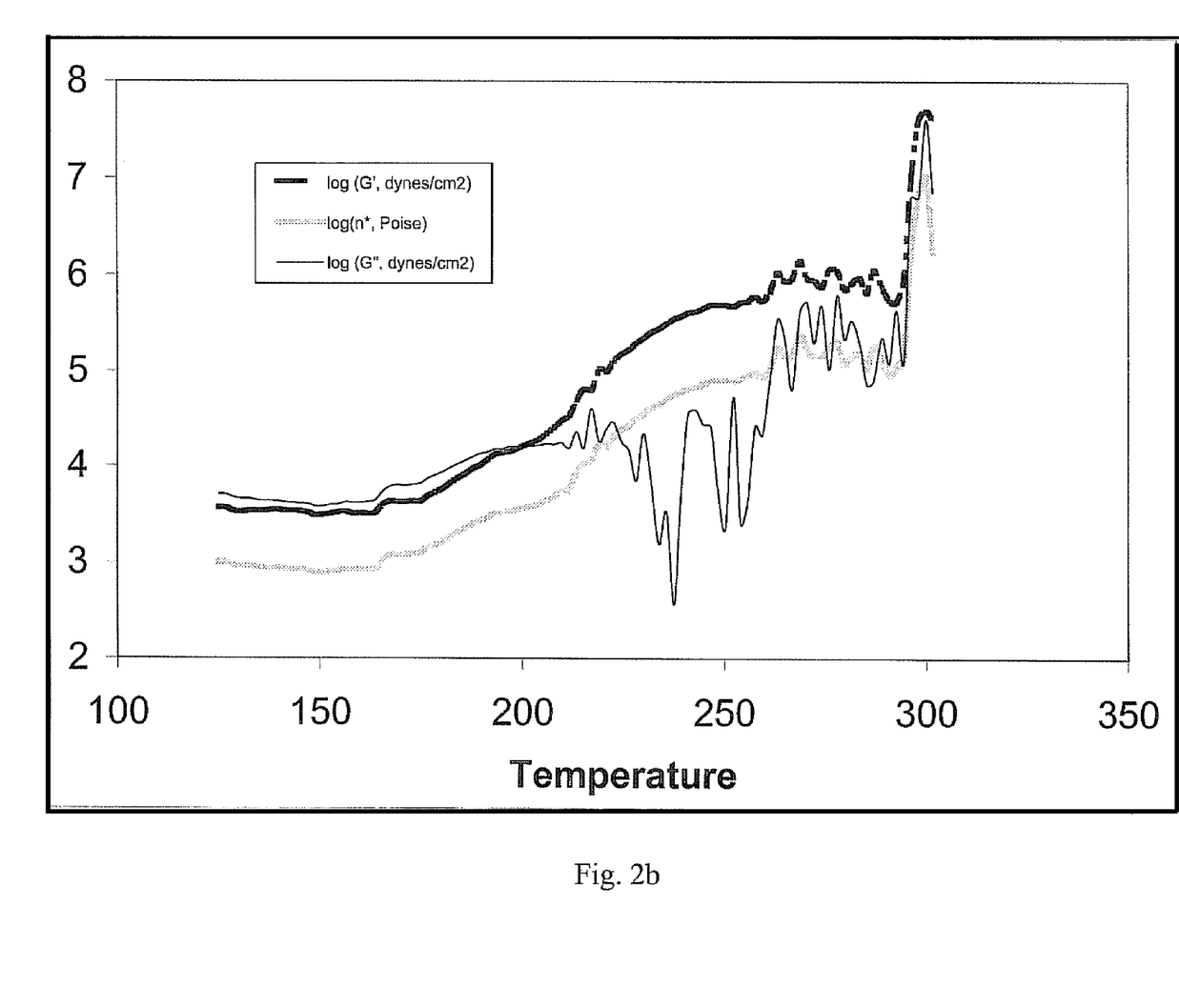

Rheological data for the materials in Examples 1 and 4 are shown in FIGS. 2a and 2b, respectively. The materials begin to crosslink at temperatures above 150° C. (for Example 1) and 200° C. (for Example 4). These materials possess storage moduli ranging from 0.1 GPa to 1 GPa. The film quality of these materials has been analyzed using acoustic experiments.

Example 6

Thermal Analysis of Polymer Used in Oxazoline Platform Bonding Compositions

Figure 3:
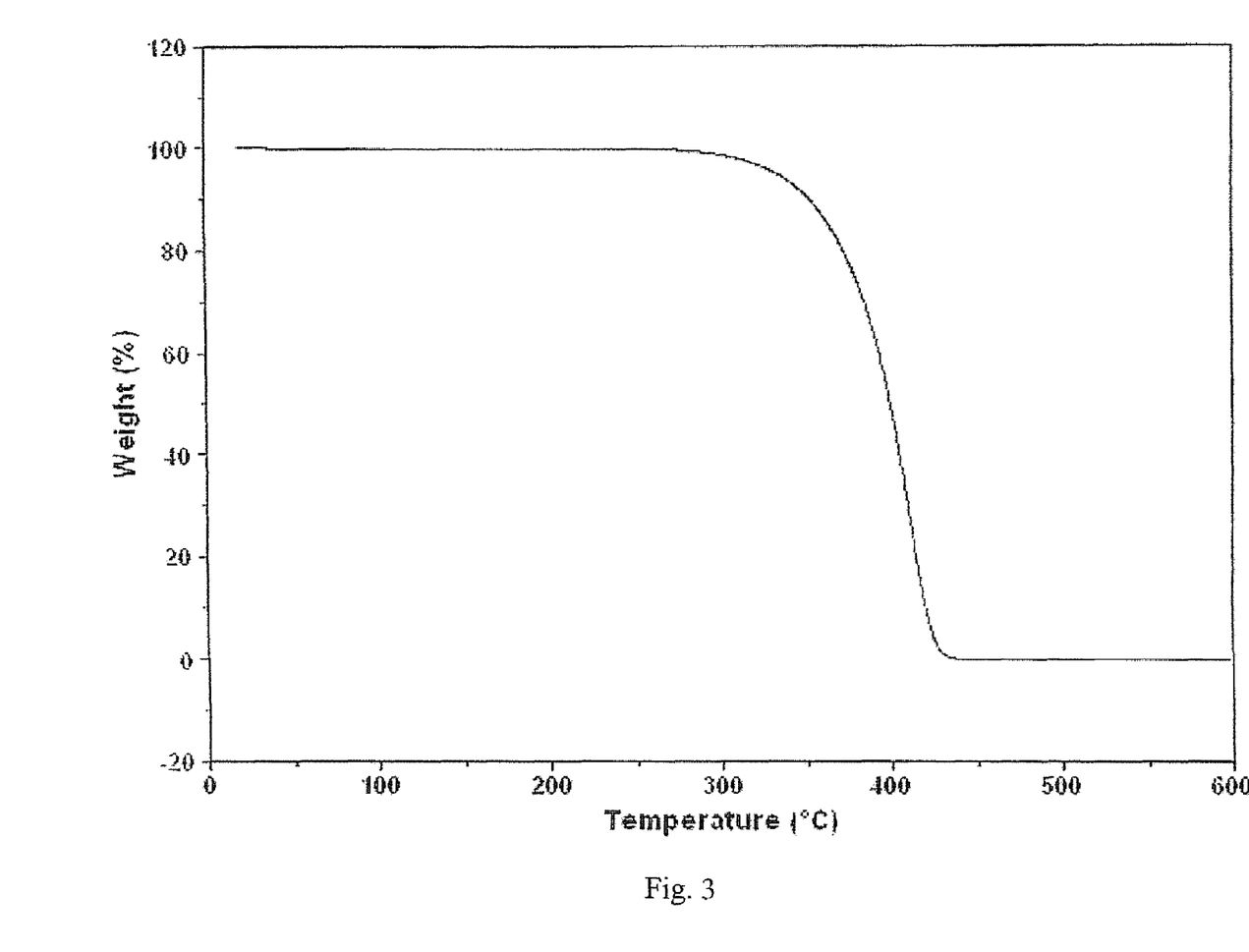
FIG. 3 is a graph depicting the thermogravimetric analysis results of a bonding composition prepared according to the present invention.

FIG. 3 shows thermogravimetric analysis (TGA) data for the poly(styrene-co-isopropenyl oxazoline) used in Examples 1, 2, and 4. It is stable up to 275-300° C. and rapidly decomposes at temperatures above 300° C. without leaving any residue. The bonding compositions derived from this polymer withstand adhesion up to 300° C. and can be removed by simple thermal decomposition after completion of wafer thinning and other "post-processing" steps.

Figure 4:
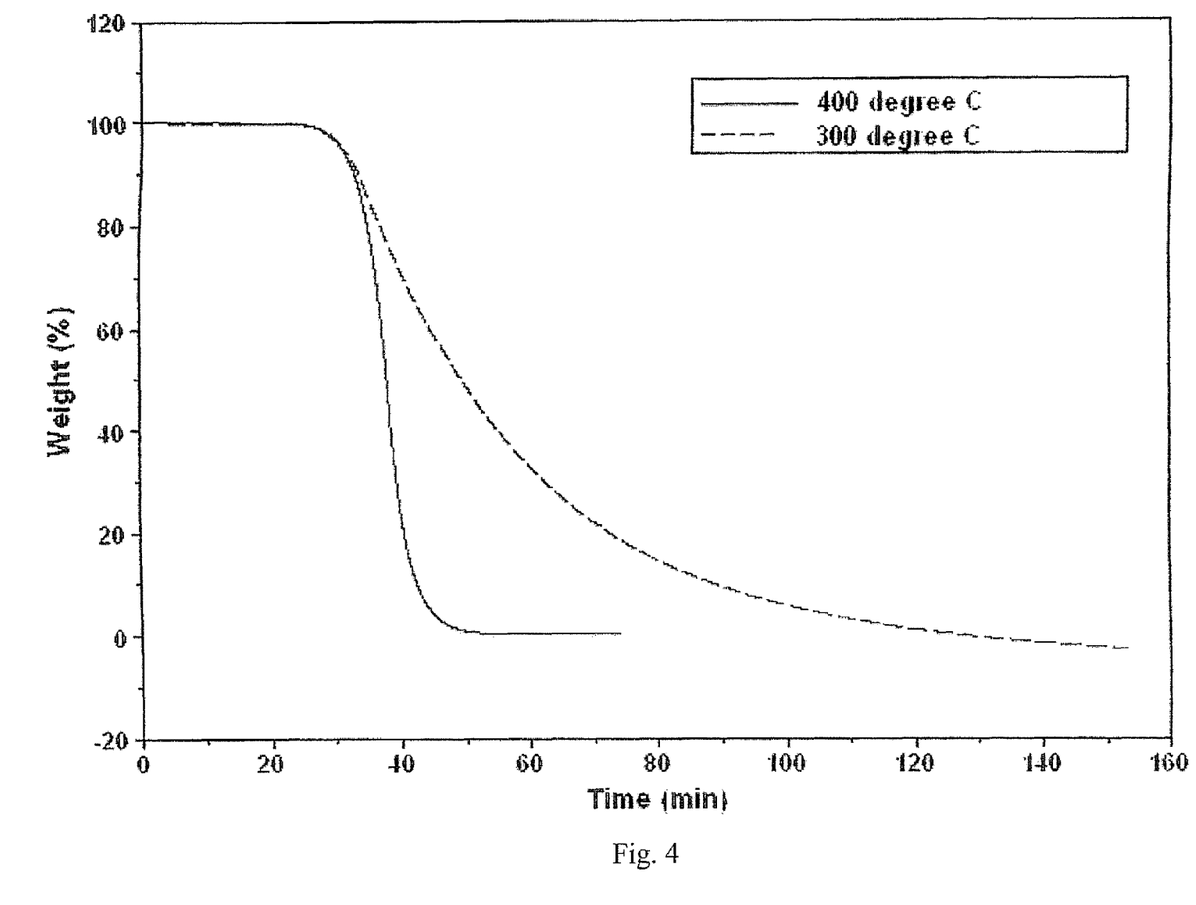
FIG. 4 is a graph depicting the thermogravimetric analysis results of a bonding composition prepared according to the present invention.

FIG. 4 shows that increasing the thermal decomposition temperature from 350° C. to 400° C. would significantly increase the rate of decomposition, and thus reduce de-bonding time.

I claim:

1. An article comprising:
a first substrate having a back surface and an active surface, said active surface comprising at least one active site and a plurality of topographical features;
a second substrate having a bonding surface; and
a bonding composition layer bonded to said active surface and to said bonding surface, said bonding composition layer comprising crosslinked oxazoline groups, wherein:
said topographical features present respective end surfaces remote from the back surface of said first substrate, and at least one of the end surfaces is further from the back surface of the first substrate than the other of said end surfaces, said further end surface defining a plane that is substantially parallel to said first surface; and the distance from said plane to the bonding surface on said second substrate varying by less than about 10% along said plane and second substrate bonding surface.

2. The article of claim 1, wherein said oxazoline groups are crosslinked with a compound selected from to group consisting of multi-functional amines, phenols, carboxylic acids, and mercaptans.

3. The article of claim 2, wherein the crosslinked oxazoline groups crosslinked have a formula selected from the group consisting of wherein:
each it is individually selected from the group consisting of —H and alkyls;
each R' is individually selected from the group consisting of —H, alkyls, phenyls, —CH$_2$OH, and —C≡N;
each X is individually selected from the group consisting of —O—, —NH—, —S—, —PO$_3$H, and —COO—;
each Y is individually selected from to group consisting of aliphatics, where:
each R'' is individually selected from to group consisting of —SO$_2$—, —C(CR$_3$)$_2$—, —O—, and —CR''''$_2$— where each R'''' is individually selected from to group consisting of —H, alkyls, and each R''' is individually selected from to group consisting of —H and to halogens.

4. The article of claim 1, wherein said bonding composition layer is formed from a bonding composition comprising a component dissolved or dispersed in a solvent system, said component having the formula (I)

where:
each R is individually selected from the group consisting of —H and alkyls;
each R' is individually selected from the group consisting of —H, alkyls, phenyls, —CH$_2$OH, and —C≡N.

5. The article of claim 4, said bonding composition further comprising a crosslinking agent having a formula selected from the group consisting of (II)

(III)

(IV)

where:
each X is individually selected from the group consisting of —OH, —NH$_2$, —SH, —PO$_3$H, and —COOH;
each Y is individually selected from the group consisting of aliphatics, -continued where:
each R'' is individually selected from the group consisting of —SO$_2$—, —C(CR$_3$)$_2$—, —O—, and —CR''''$_2$—, where each R'''' is individually selected from the group consisting of —H, alkyls, and each R''' is individually selected from the group consisting of —H and the halogens;
each D is individually selected from the group consisting of —C— and —; and
each Z is individually selected from the group consisting of —SH, —COOH, —OH, —NH$_2$, —PO$_3$H, and —N(CH$_2$OCH$_3$)$_2$.

6. The article of claim 1, said bonding composition layer:
having a thickness defined as the distance from the active surface to the bonding surface; and
comprising the same composition across said thickness.

7. The article of claim 1, wherein said first substrate:
comprises at least one active site and plurality of topographical features on said active surface; and
is selected from the group consisting of microelectromechanical system devices, display devices, flexible substrates, compound semiconductors, low k dielectric layers, dielectric layers, ion implant layers, and substrates comprising silicon, aluminum, tungsten, tungsten silicide, gallium arsenide, germanium, tantalum, tantalum nitrite, SiGe, and mixtures of the foregoing.

8. The article of claim 1, wherein said second substrate comprises a material selected from the group consisting of glass, quartz, sapphire, aluminum, and silicon.

9. The article of claim 1, wherein said bonding composition layer has a thermal decomposition temperature of at least about 285° C.

10. A wafer bonding method comprising:
providing a stack comprising first and second substrates bonded together via a bonding composition layer comprising crosslinked oxazoline groups; and
exposing said stack to a temperature of at least about 285° C. so as to thermally decompose said bonding composition layer and cause said first and second substrates to separate.

11. The method of claim 10, further comprising thinning one of said substrates prior to said exposing.

12. The method of claim 10, further comprising subjecting said stack to a process selected from the group consisting of backgrinding, metallizing, patterning, and combinations thereof prior to said exposing.

13. The method of claim 10, wherein the crosslinked oxazoline groups have a formula selected from the group consisting of wherein:
each R is individually selected from the group consisting of —H and alkyls;
each R' is individually selected from the group consisting of —H, alkyls, phenyls, —CH$_2$OH, and —C≡N;
each X is individually selected from the group consisting of —O—, —NH—, —S—, —PO$_3$H, and —COO—;
each Y is individually selected from the group consisting of aliphatics, where:
each R'' is individually selected from the group consisting of —SO$_2$—, —C(CR$_3$)$_2$—, —O—, and —CR''''$_2$— where each R'''' is individually selected from the group consisting of —H, alkyls, and each R''' is individually selected from the group consisting of —H and the halogens.

14. The method of claim 10, wherein said providing a stack comprises:
applying a bonding composition to at least one of the first and second substrates; and contacting the substrates with one another so as to bond the substrates together.

15. The method of claim 14, wherein said applying comprises spincoating the bonding composition onto one of the first and second substrates.

16. The method of claim 14, wherein said bonding composition comprises a component dissolved or dispersed in a solvent system, said component having the formula (I)

where:
each R is individually selected from the group consisting of —H and alkyls;
each R' is individually selected from the group consisting of —H, alkyls, phenyls, —CH$_2$OH, and —C≡N.

17. The method of claim 16, said bonding composition further comprising a crosslinking agent having a formula selected from the group consisting of

X'—Y—X',    (II)

where:
each X' is individually selected from the group consisting of —OH, —NH$_2$, —SH, —PO$_3$H, and —COOH;
each Y is individually selected from the group consisting of aliphatics, where:
each R″ is individually selected from the group consisting of —SO$_2$—, —C(CR$_3$)$_2$—, —O—, and —CR″″$_2$—, where each R″″ is individually selected from the group consisting of —H, alkyls, and ; and each R‴ is individually selected from the group consisting of —H and the halogens;
each D is individually selected from the group consisting of —C— and —N—; and
each Z is individually selected from the group consisting of —SH, —COOH, —OH, —NH$_2$, —PO$_3$H, and —N(CH$_2$OCH$_3$)$_2$.

18. The method of claim 14, wherein said contacting comprises applying pressure to the substrates.

19. The method of claim 10, wherein said first substrate has a first surface and a second surface remote from said first surface and comprising at least one active site and plurality of topographical features, and said bonding composition layer is bonded to said second surface.

20. The method of claim 19, wherein said second substrate comprises a bonding surface that is bonded to said bonding composition layer.

21. The method of claim 20, wherein:
said topographical features present respective end surfaces remote from the first surface of said first substrate, and at least one of the end surfaces is further from the first surface of the first substrate than the other of said end surfaces, said further end surface defining a plane that is substantially parallel to said first surface; and
the distance from said plane to the bonding surface on said second substrate varying by less than about 10% across said plane and second substrate bonding surface.

22. The method of claim 10, wherein said first substrate:
has a first surface and a second surface remote from said first surface;
comprises at least one active site and plurality of topographical features on said second surface; and
is selected from the group consisting of microelectromechanical system devices, display devices, flexible substrates, compound semiconductors, low k dielectric layers, dielectric layers, ion implant layers, and substrates comprising silicon, aluminum, tungsten, tungsten silicide, gallium arsenide, germanium, tantalum, tantalum nitrite, SiGe, and mixtures of the foregoing.

23. The method of claim 10, wherein said second substrate comprises a material selected from the group consisting of sapphire, ceramic, glass, quartz, aluminum, and silicon.

* * * * *